US008258786B2

(12) United States Patent
Hennel

(10) Patent No.: US 8,258,786 B2
(45) Date of Patent: Sep. 4, 2012

(54) METHOD FOR MAPPING OF THE RADIO FREQUENCY FIELD AMPLITUDE IN A MAGNETIC RESONANCE IMAGING SYSTEM USING ADIABATIC EXCITATION PULSES

(75) Inventor: Franciszek Hennel, Karlsruhe (DE)

(73) Assignee: Bruker Biospin MRI GmbH, Ettlingen (DE)

( * ) Notice: Subject to any disclaimer, the term of this patent is extended or adjusted under 35 U.S.C. 154(b) by 365 days.

(21) Appl. No.: 12/659,240

(22) Filed: Mar. 2, 2010

(65) Prior Publication Data

US 2010/0237861 A1 Sep. 23, 2010

(30) Foreign Application Priority Data

Mar. 18, 2009 (EP) .................................... 09003853

(51) Int. Cl.
*G01R 33/44* (2006.01)
*G01V 3/00* (2006.01)
(52) U.S. Cl. ........ 324/307; 324/309; 324/310; 382/128; 600/407; 600/410
(58) Field of Classification Search .......... 324/300–322; 382/128–133; 600/407–464
See application file for complete search history.

(56) References Cited

U.S. PATENT DOCUMENTS

| | | | |
|---|---|---|---|
| 5,019,784 A | | 5/1991 | Garwood |
| 6,268,728 B1 * | | 7/2001 | Morrell ......................... 324/307 |
| 6,750,649 B1 | | 6/2004 | Rosenfeld |
| 7,372,270 B2 * | | 5/2008 | Sung et al. .................... 324/314 |
| 2009/0108844 A1 * | | 4/2009 | Sodickson et al. ............ 324/309 |
| 2012/0074939 A1 * | | 3/2012 | Fautz ............................ 324/309 |

OTHER PUBLICATIONS

Shultz, K. et al., "Adiabatic B1 Mapping for RF Current Density Imaging", Proceedings of the International Society for Magnetic Resonance in Medicine, 16th Annual Meeting Proceedings, May 3, 2008, p. 1245.
Meriles, C.A. et al., "Broadband phase modulation by adiabatic pulses", Journal of Magnetic Resonance, vol. 164, Sep. 2003, pp. 177-181.
De Graaf R. A. et al., "Adiabatic Rare Imaging", NMR in Biomedicine, vol. 16, Feb. 2003, pp. 29-35.
Oh C.H. et al., "Radio Frequency Field Intensity Mapping Using a Composite spin-Echo Sequence", Magnetic Resonance Imaging, vol. 8, 1990, pp. 21-25.
Morrell, G.R., "A Phase-Sensitive Method of Flip Angle Mapping", Magnetic Resonannce in Medicine, vol. 60, No. 4, Oct. 2008 pp. 889-894.

(Continued)

*Primary Examiner* — Melissa Koval
*Assistant Examiner* — Emily Chan
(74) *Attorney, Agent, or Firm* — Paul Vincent

(57) ABSTRACT

A method for determining the spatial distribution of the magnitude of the radio frequency transmission field B1 in a magnetic resonance imaging apparatus, wherein the method comprises performing an MRI experiment in which a B1-sensitive complex image (SI) of a sample is obtained, wherein the phase distribution within the B1-sensitive complex image (SI) depends on the spatial distribution of the magnitude of the field B1. For establishing the dependency of the phase distribution within the B1-sensitive complex image (SI) on the spatial distribution of the field B1, one or more adiabatic RF pulses are applied. The method provides a simple procedure for mapping the B1 field of a magnetic resonance imaging apparatus with an improved accuracy and a wider measurement range.

6 Claims, 7 Drawing Sheets

OTHER PUBLICATIONS

Stollberger and P. Wach., "Imaging of the Active $B_1$ Field in Vivo", Magn. Reson. Med. 35, pp. 246-251, 1996.

V.L. Yarnykh, "Actual Flip-Angle Imaging in the Pulsed Steady State: A method for Rapid Three-Dimensional Mapping of the Transmitted Radiofrequency Field" Magn. Reson. Med. 57, 192-200 (2007).

J. Hennig, A. Nauerth, H. Friedburg, "RARE Imaging: A Fast Imaging method for Clinical MR" Magn. Reson. Med. 3, 823-833 (1986).

A. Tannus and M. Garwood, "Adiabatic Pulses" NMR Biomed., 10, 423-434 (1997).

S. Conolly et al., "A Reduced Power Selective Adiabatic Spin-Echo Pulse sequence" Mag. Reson. Med. 18, 28-38 (1991).

* cited by examiner

METHOD FOR MAPPING OF THE RADIO FREQUENCY FIELD AMPLITUDE IN A MAGNETIC RESONANCE IMAGING SYSTEM USING ADIABATIC EXCITATION PULSES

This application claims Paris Convention priority of EP 09 003 853.0 filed Mar. 18, 2009 the complete disclosure of which is hereby incorporated by reference.

BACKGROUND OF THE INVENTION

The invention relates to a method for determining the spatial distribution of the magnitude of the radio frequency (=RF) transmission field B1 in a magnetic resonance imaging (=MRI) apparatus, wherein the method comprises performing an MRI experiment in which a B1-sensitive complex image, with a real part and an imaginary part, of a sample is obtained, wherein the phase distribution, with the phase determined by the arc tangent function, within the B1-sensitive complex image depends on the spatial distribution of the magnitude of the field B1.

Such a method is known from U.S. Pat. No. 6,268,728 B1, see Ref. [3].

In a MRI (=Magnetic Resonance Imaging) apparatus, the signal used for image reconstruction is generated by the component of the nuclear magnetization that is transverse relative to the main magnetic field axis. The transverse magnetization is created by exciting the nuclear spins with one or several pulses of a transverse magnetic field oscillating with the resonance frequency, typically in the radio wave range. This so called radio-frequency (RF) field, commonly denoted B1, is produced by an electrical circuit called transmission coil that is designed to obtain a possibly uniform distribution of the B1 field strength in the volume of interest. However, due to design imperfections and due to the electromagnetic properties of the object being imaged, the effective RF field is not uniform, leading to a spatially non-uniform excitation. This, in turn, leads to non-uniform image intensity and contrast.

When the spatial distribution of the effective RF field (i.e. the B1 map) is known, it is possible to correct the image intensity digitally to compensate for the non-uniform excitation. It is also possible to design two- or three-dimensional RF pulses that can take the B1 inhomogeneity into account and produce a uniform excitation. The knowledge of B1 maps is also essential in the technique of parallel excitation with several circuits to obtain a homogeneous excitation in the volume of interest. For this reason, there has been a considerable interest in the development of B1 mapping methods.

Several methods for B1-field mapping have been proposed using signal intensity as the indicator of the B1 strength. These involve comparisons of image intensities obtained with different RF intensities [1] and comparisons of images acquired with a single RF field intensity but various repetition times [2]. The drawback of these methods is that the signal intensity vs. B1 relation is rather complex and depends on relaxation properties of the object, which are spatially non-uniform and may falsify the result.

An interesting alternative to the intensity-based B1-mapping methods is the phase-based method [3, 4]. The transverse magnetization is generated by a pair of RF pulses in such a way that its direction in the rotating frame (coordinate system rotating around the main magnetic field with the resonance frequency), and thus the signal phase, depends on the strength of the B1 field. More specifically, in the method of [3, 4], a non-selective pulse with a flip angle of 2α about the x axis is followed by a non-selective pulse with a flip angle of α about the y axis. The amplitude of the signal is irrelevant in this method as long as it is high enough to allow the calculation of the phase, and the dependence of the measurement on the relaxation properties of the object is avoided.

Both the intensity-based and the phase-based B1 mapping methods can measure the B1 field in a limited range of values. The lower limit of this range is determined by the noise: an RF field intensity below this limit will generate transverse magnetization that is too low to be detected in the presence of noise. The upper limit is given by the field strength which flips the magnetization by 180 degrees and does not produce detectable signal either.

Adiabatic RF pulses are a well known tool to perform rotations of the magnetization independently on the amplitude of the B1 field [5]. These pulses involve a sweep of the RF frequency during the application of the pulse. The sweep can either start on-resonance and move to off-resonance or the other way round, as in the Adiabatic Half-Passage (AHP) pulses, or it can by symmetric, starting on one side of the resonance frequency and moving to the other side, as in the Adiabatic Full-Passage (AFP) pulses. Possible applications of adiabatic pulses include the creation of a free induction decay signal using a single AHP pulse, or the generation of a spin echo signal by a standard excitation followed by an AFP refocusing pulse. In both cases, the amplitude of the transverse magnetization is maximal for any B1 amplitude above a certain threshold. The phase of the magnetization, however, strongly depends on the B1 amplitude. This dependence has been regarded as an unwanted effect since it may cause a cancellation of signals emitted from different object positions. Various composite AHP/AFP pulse sequences have therefore been proposed to achieve B1-insensitive rotations of the magnetization [6].

K. Shultz et al., Proc. Intl. Soc. Mag. Reson. Med. 16 (2008), p. 1245, describes adiabatic B1 mapping for RF current density imaging, wherein a measured signal amplitude is analysed.

C. A. Meriles et al., Journal of Magnetic Resonance 164 (2003), 177-181, describes the use of a gradient of the B1 field to produce a desired phase modulation pattern of the transverse magnetisation.

U.S. Pat. No. 6,750,649 B1 describes the design of adiabatic pulses. An adiabatic pulse starting off-resonance and ending on-resonance is used to map an RF amplitude by determining a phase of a return signal as a function of spatial location.

It is the object of the invention to provide a simple method for mapping the B1 field of a magnetic resonance imaging apparatus with an improved accuracy and a wider measurement range.

SUMMARY OF THE INVENTION

This object is achieved, in accordance with the invention, by a method as introduced in the beginning, characterized in that for establishing the dependency of the phase distribution within the B1-sensitive complex image on the spatial distribution of the field B1, one or more adiabatic RF pulses with a frequency sweep ending off-resonance are applied, that for eliminating any superimposed phase distribution components of the B1-sensitive complex image which are independent of the field B1, a reference complex image of the sample is obtained which has the same superimposed phase distribution components, that a phase difference image of the B1-sensitive complex image and the reference complex image is obtained, and that a B1 magnitude image is calculated from the phase difference image.

The idea underlying this invention is that the B1-sensitivity of the phase of the transverse magnetization generated with adiabatic RF pulses, in particular AFP and AHP pulses, can be employed to map the spatial distribution of B1-intensity. In contrast to conventional radio frequency (RF) pulses, the inventive method establishes a rather strong dependency of the phase in the complex image on the B1 intensity. Even small inhomogeneities in the B1 field distribution can be measured with good accuracy and over a wide range of B1 values.

The inventive method obtains a B1-sensitive complex image of a volume of interest (sample volume) of the MRI apparatus, already containing a sample. Said B1-sensitive complex image represents a measured transverse magnetisation with its x component in the real part (Re), and the y component in the imaginary part (Im). The phase of the transverse magnetization at a specific location, which can be determined using the arc tangent function, can be converted into the local B1 field value, typically by using numerical methods making use of the known correlation between B1 and the phase for the applied adiabatic pulse type. Note that the local phase of the transverse magnetization may be corrected for B1-independent factors (such as inhomogeneities of the static magnetic field $B_0$), if these factors are of relevance.

The inventive method thus offers a calibration measurement for determining the B1 field distribution, which can be done with the sample included; no calibration sample is necessary. The resulting B1 sensitivity map can be used to correct an image obtained from the sample with arbitrary power of the RF transmission coil and arbitrary RF pulse shape.

The method in accordance with the invention derives the B1 values from the phase of the transverse magnetisation, while the magnitude of the transverse magnetisation, which depends on the relaxation properties of the sample is irrelevant. Therefore, the relaxation properties of the sample of interest are irrelevant for the inventive method. Additionally, due to the B1-insensitive amplitude of the transverse magnetization generated with adiabatic pulses, the phase can be determined in a higher range of B1 values as compared to conventional pulses used in conventional phase-sensitive B1 mapping. It should be noted that an adiabatic pulse, in accordance with the invention, may have a varying frequency over the course of time, in particular wherein the sweep speed ($\Delta\omega/\Delta t$) may vary over the course of time, and may have a varying pulse amplitude over the course of time.

In the inventive method, by using the reference complex image, the accuracy of the determined B1 magnitude image is improved. The method is particularly beneficial when B1-independent factors have a considerable influence on the local phase of the transverse magnetization, in particular when the static magnetic field has a lower homogeneity.

Three different embodiments of this invention are presented (see below): using the acquisition of a gradient echo generated with an AHP pulse starting on-resonance, using a spin-echo generated by an AFP pulse, and using a train of AFP pulses to produce a fast acquisition based on the principles of the RARE technique [7]. In all these cases the advantage of a relaxation-independent measurement characteristic for phase-based methods is assured. However, the expert in the field will find further experiments which can use the principles of the present invention.

A preferred variant of the inventive method provides that the B1-sensitive complex image is acquired with a gradient-echo imaging method using an adiabatic half-passage RF excitation pulse with a frequency sweep starting on-resonance, and the that the reference complex image is acquired with the same gradient-echo imaging method using a non-adiabatic RF pulse. This is simple to perform in practice, requiring only a minimum of RF power deposition in the sample.

In an alternative variant, the MRI experiment comprises an imaging sequence which contains
  an excitation RF pulse of any type,
  followed by an adiabatic full-passage refocusing pulse to generate a first spin-echo signal,
  which in turn is followed by a second adiabatic full-passage refocusing pulse to produce a second spin-echo signal,
wherein the first spin echo signal is used to produce the B1-sensitive complex image, and the second spin-echo signal is used to produce the reference complex image. Here the same original excitation can be used to obtain both the B1-sensitive complex image and the reference complex image leading to a two-fold reduction of the measurement time.

Moreover, another alternative variant is characterized in that the MRI experiment comprises an imaging sequence which contains
  an excitation RF pulse of any type,
  followed by a periodic train of adiabatic full-passage RF pulses to produce a train of spin-echoes, in which after every two spin-echoes the encoding changes so that consecutive pairs of spin-echoes are differently encoded,
and that the odd spin-echoes are used to produce the B1-sensitive complex image, and the even spin-echoes are used to produce the reference complex image. This procedure allows a significant reduction of measurement time. The encoding may be similar to that used in RARE imaging techniques.

In another variant of the inventive method, the B1 magnitude image is saved digitally and used for image postprocessing. With the image postprocessing, artefacts in the image of a sample of interest which are due to inhomogeneities in the B1 field distribution may be eliminated.

Preferred is further a variant wherein the B1 magnitude image is used to determine parameters controlling the RF transmission in an MRI apparatus. In particular, the B1 map can be the basis for calculating the power and/or other properties of an rf transmission pulse or pulse sequence used for imaging of a sample, thus preventing the generation of artefacts from the beginning.

Further advantages can be extracted from the description and the enclosed drawing. The features mentioned above and below can be used in accordance with the invention either individually or collectively in any combination. The embodiments mentioned are not to be understood as exhaustive enumeration but rather have exemplary character for the description of the invention.

The invention is shown in the drawing.

DESCRIPTION OF THE PREFERRED EMBODIMENT

Figure 1:
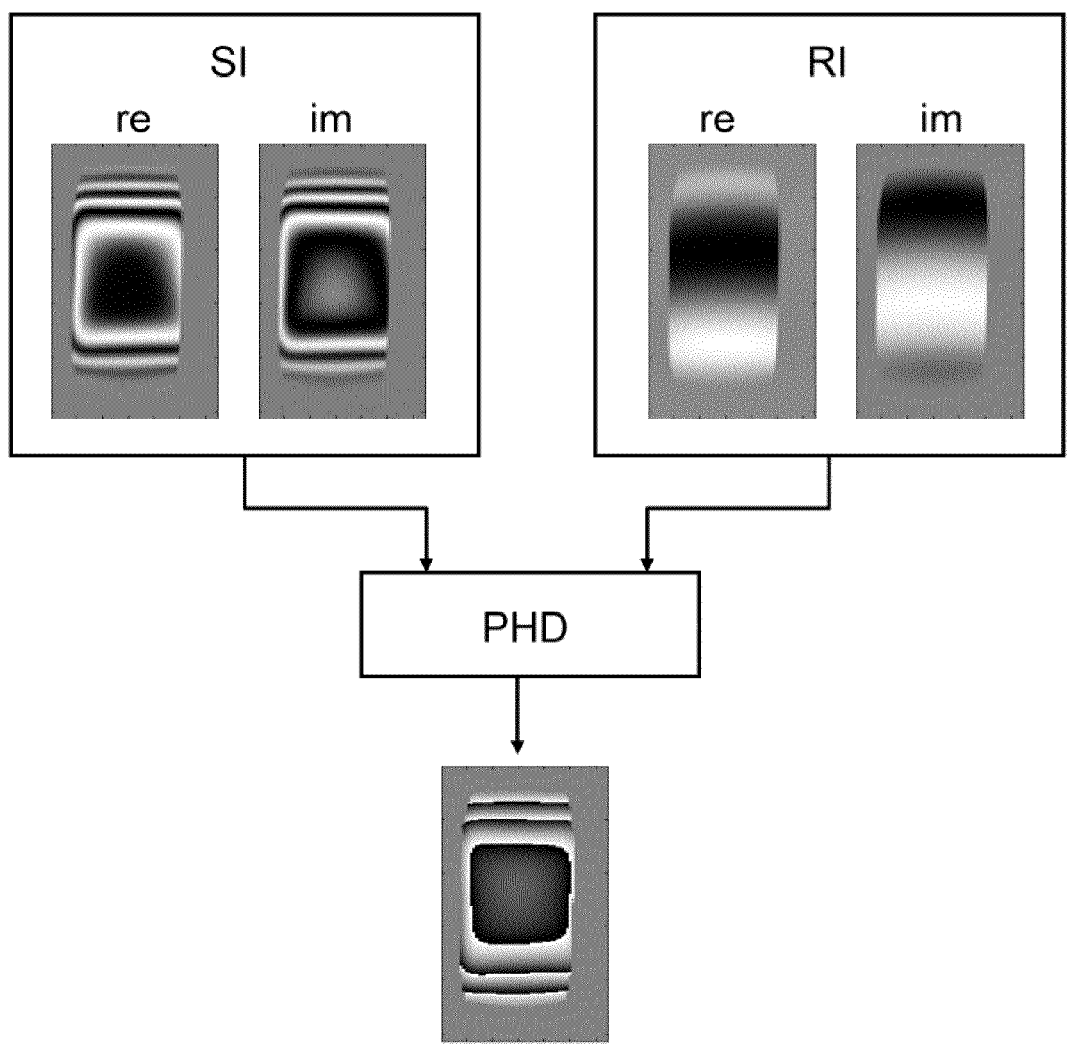
FIG. 1: Illustration of the principle of the reconstruction used in accordance with the invention. Two complex images are acquired, whereby the B1-sensitive image (SI) contains a phase component that is dependent on the B1 field strength, and the reference image (RI) does not contain this component. The final phase image (PI) is calculated as a phase difference (PHD) between images SI and RI.

A method to measure maps of the radio-frequency field (B1) in magnetic resonance imaging (MRI) devices is disclosed. The method is based on an MRI experiment in which a complex image is generated using one or more adiabatic radio-frequency pulses in such a way that the phase of the complex image elements depends on the amplitude of the B1 field. Additional, B1-independent components of the phase may be removed by comparison with reference images. Possible embodiments of the invention include the acquisition of a gradient echo produced with an adiabatic half-passage pulse, acquisition of a spin echo produced by an adiabatic full-passage pulse, and fast spin echo acquisition using a train of adiabatic full-passage pulses.

Adiabatic Pulses

An adiabatic pulse can be described by two driving functions: B1(t) giving the amplitude of the transverse magnetic field in time, and $\Delta\omega(t)=\omega_{RF}(t)-\omega_0$ giving the deviation of the instantaneous transmitter frequency $\omega_{RF}(t)$ from the resonance frequency of the spins, $\omega_0$. Several ways of choosing these functions are described in the literature, but the actual choice in not relevant for the present invention, provided these functions fulfill the well known adiabaticity conditions. During the application of the adiabatic pulse, the nuclear spin magnetization, observed in the reference frame rotating about the axis of the main magnetic field with the angular frequency $\omega_{RF}(t)$, called RF frame, rotates about the effective RF field vector $B1_{eff}$ having a longitudinal component $\Delta\omega(t)/\gamma$ and a transverse component B1(t), where γ is the gyromagnetic ratio of the nuclei. The angular frequency of this rotation is given by the Larmor relation:

$$\omega_{eff}(t)=\gamma|B1_{eff}|=\gamma\sqrt{B1(t)^2+[\Delta\omega(t)/\gamma]^2}$$

The vector $B1_{eff}$ changes direction during the duration of the pulse as determined by the driving functions B1(t) and Δω(t). The adiabaticity condition mentioned above requires that the angular velocity of the vector $B1_{eff}$ be lower than $\omega_{eff}$(t). Under this condition, the magnetization keeps rotating around this vector. In particular, all magnetization vectors lying on the plane orthogonal to $B1_{eff}$ at the beginning of the pulse remain orthogonal to $B1_{eff}$ until the end of the pulse. An adiabatic pulse is thus capable of making plane rotations of the nuclear magnetization. Within such an orthogonal plane, however, all magnetization vectors rotate with the angular frequency $\omega_{eff}$(t). The total rotation angle accrued by the magnetization during the duration T of the pulse is $$\varphi = \int_0^T \omega_{eff}(t)dt,$$

and thus depends on the amplitude of the RF field B1. When the adiabatic pulse ends its frequency sweep off-resonance, the final direction of the vector $B1_{eff}$ is parallel to the main magnetic field and the rotation angle φ determines the phase of the transverse magnetization.

The basic idea of this invention is to use one or more adiabatic pulses in such a way that the rotation angle accrued by the magnetization during the pulse appears as a component of the phase of the transverse magnetization that is detected in the experiment and, upon the reconstruction of a complex image, determines the phase of the complex pixels. A method in accordance with the invention will therefore use at least one adiabatic pulse with the frequency sweep ending off resonance. Typical examples of such pulses are the adiabatic half-passage pulse starting the sweep on resonance and ending off resonance, and the adiabatic full-passage pulse, which starts and ends the sweep off resonance. An RF pulse ending its frequency sweep on resonance will not produce a phase dependence on B1, except for a limited range of B1 values where the pulse is not fully adiabatic (see U.S. Pat. No. 6,750,649 B1), and will therefore not be used in a method in accordance with the invention.

Since the phase of the complex image may also have other components depending on the way the transverse magnetization is generated and detected, and on the way the image is reconstructed, it may be necessary to acquire a second image for a reference. This reference image must be acquired in a similar sequence and with identical reconstruction procedure, however, without the phase rotation produced by the adiabatic pulse. The final phase image is reconstructed as a phase difference between the B1-sensitive image and the reference image, as shown in FIG. 1. The final phase image (or phase difference image PI) represents exclusively the phase component that depends on the B1 amplitude. The actual dependence of this phase component on the B1 amplitude can be obtained in a numerical simulation of the magnetization rotation about the effective RF vector $B1_{eff}$ and used to reconstruct B1 amplitude values from the final phase image.

Variant with Gradient Echo Imaging Based on an AHP Pulse

One possible embodiment of the invention is a gradient echo imaging experiment with the excitation made by an AHP pulse starting on resonance and ending off resonance. This pulse produces a 90 degree rotation of the plane that is parallel to the main magnetic field at the beginning of the pulse. The equilibrium magnetization vector, which is parallel to the axis of the main magnetic field, is thus rotated to the transverse plane. Its phase, however, contains the component φ mentioned above, which is dependent on the amplitude of the RF field.

Figure 2:
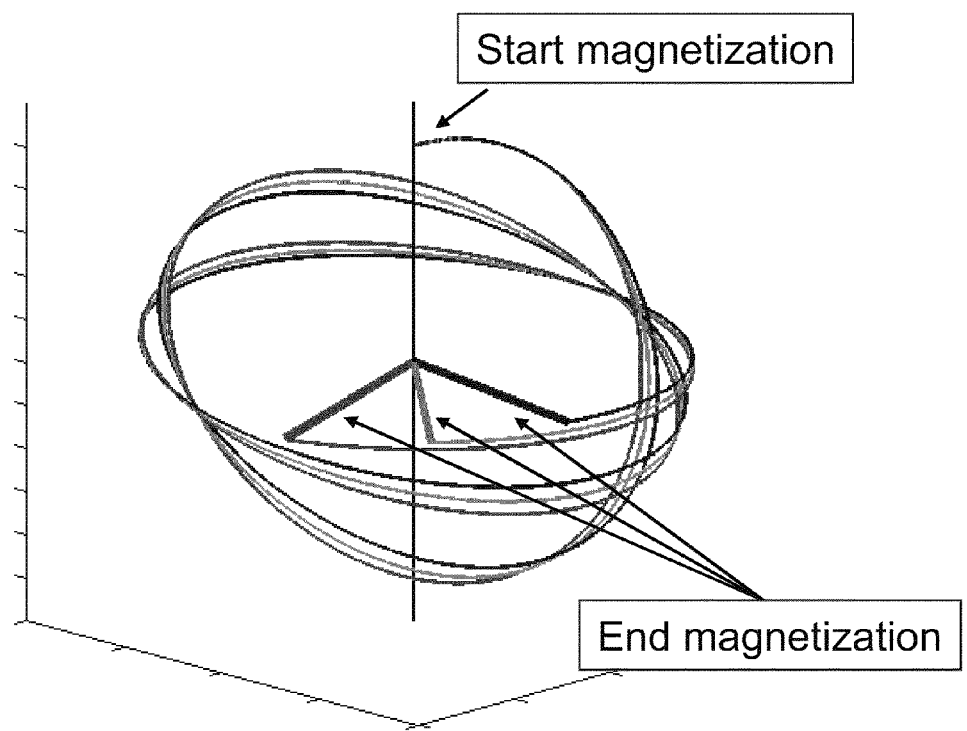
FIG. 2: Illustration of the evolution of the magnetization under the influence of an adiabatic half-passage pulse with a frequency sweep starting on resonance, calculated for three different values of the B1 field. The final magnetization is transverse and its direction (phase) depends on B1.

The action of such a pulse with a cosine-modulated frequency sweep and a sine-modulated amplitude, 2 ms duration, and a 1.6 kHz sweep range is represented in FIG. 2 based on a numerical simulation. The three curves show the traces made by the tip of the magnetization vector, oriented initially along the longitudinal axis, and evolving under the influence of the AHP pulse with three different peak amplitudes: $\gamma B1/2\pi$=0.9, 1.0, 1.1 kHz. It can be clearly seen that the three final magnetization vectors lie in the transverse plane and have clearly different phases.

Figure 3:
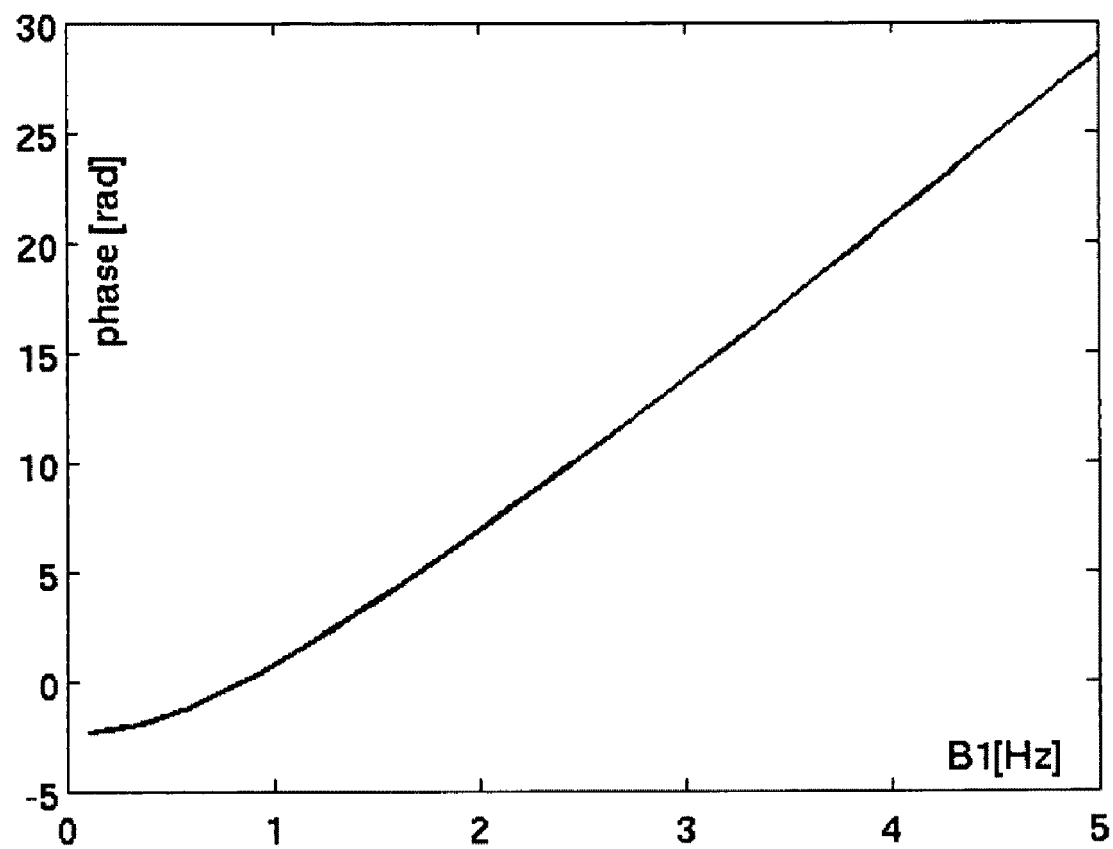
FIG. 3: Diagram illustration the dependence of the phase of the transverse magnetization generated with an AHP pulse on the strength of the B1 field.

Using a similar simulation, a plot showing the dependence of the final magnetization phase on the peak B1 value of the pulse has been created and used to derive RF field values in Hz units from the final phase map, see FIG. 3.

Figure 4:
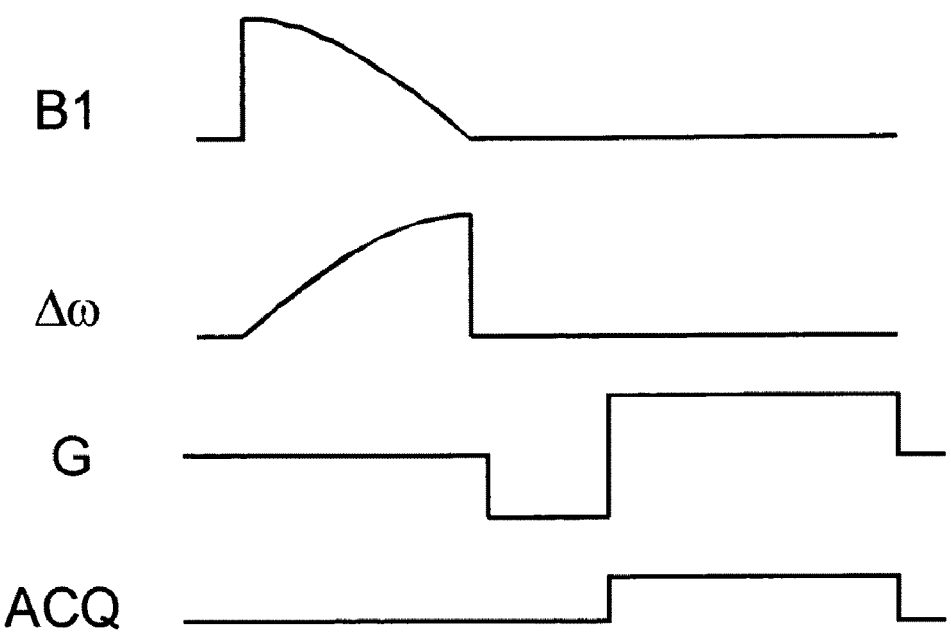
FIG. 4: Schematic depiction of the pulse sequence of an embodiment of the invention using an AHP pulse for the excitation. A—acquisition of the B1-sensitive image. B—acquisition of the reference image. Meaning of symbols: B1—time course of the intensity of the applied RF field; Δω—time course of the frequency offset of the applied RF field with respect to the resonance frequency, G—schematic representation of time course of the readout gradient, ACQ—the signal acquisition period. The time course of the gradient is not essential for the invention. The actual time course may be different and may include more gradient channels.
Figure 4:
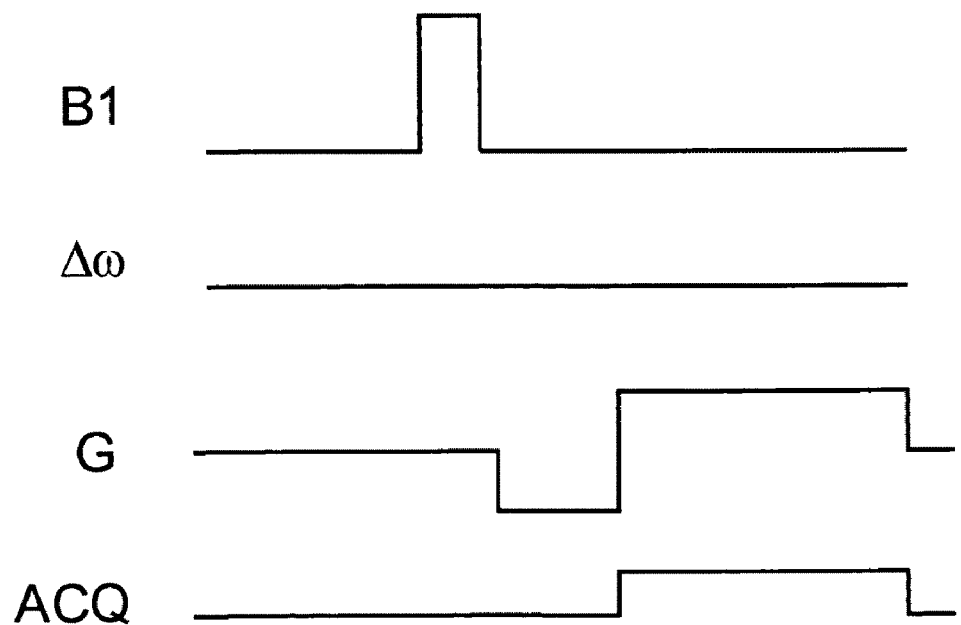
Figure 5:
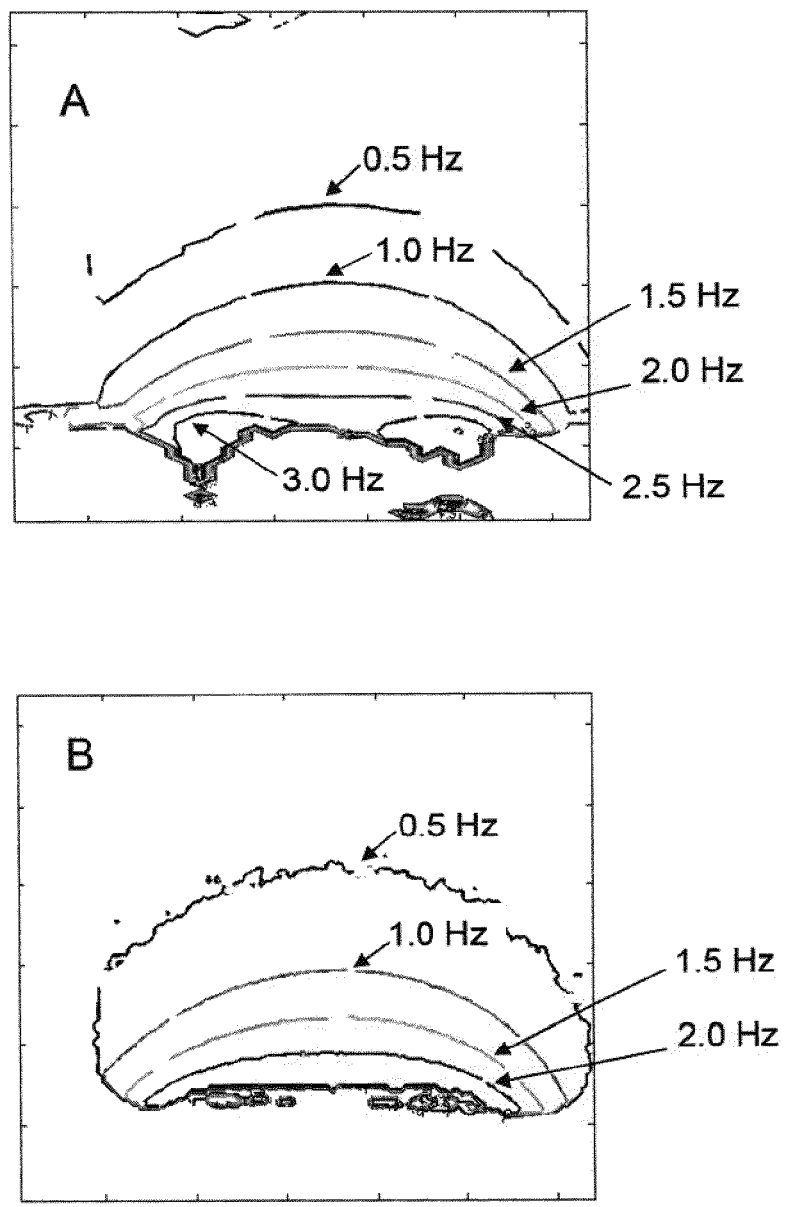
FIG. 5: A—Contour plot of the B1 field created by a surface transmission coil measured using the embodiment of the invention using the AHP pulse. B—Contour plot measured with a known method based on signal intensity comparison. The coordinates span a 4 cm×4 cm field of view. Contours are represented for the values of $\gamma B1/2\pi$=0.5, 1, 1.5, 2.5, 3.0 kHz.

The final phase map has been calculated as a phase difference between two complex 3D gradient echo images acquired with the AHP pulse and with a conventional RF pulse that does not produce a B1-dependent phase, compare FIG. 4 for the pulse sequence. The resulting B1 map for a circular surface transmission coil is represented in FIG. 5, part A and compared with a map measured using one of the previously proposed techniques based on signal amplitude, see FIG. 5, part B. It can be appreciated that the phase-based method using the adiabatic pulse has a higher dynamic range: the distant contours corresponding to low B1 values are less affected by noise, and additional contours showing the high B1 values in the vicinity of the coil circuit can be reconstructed.

Variant Based on Spin Echo Imaging Based on AFP Pulses

Figure 6:
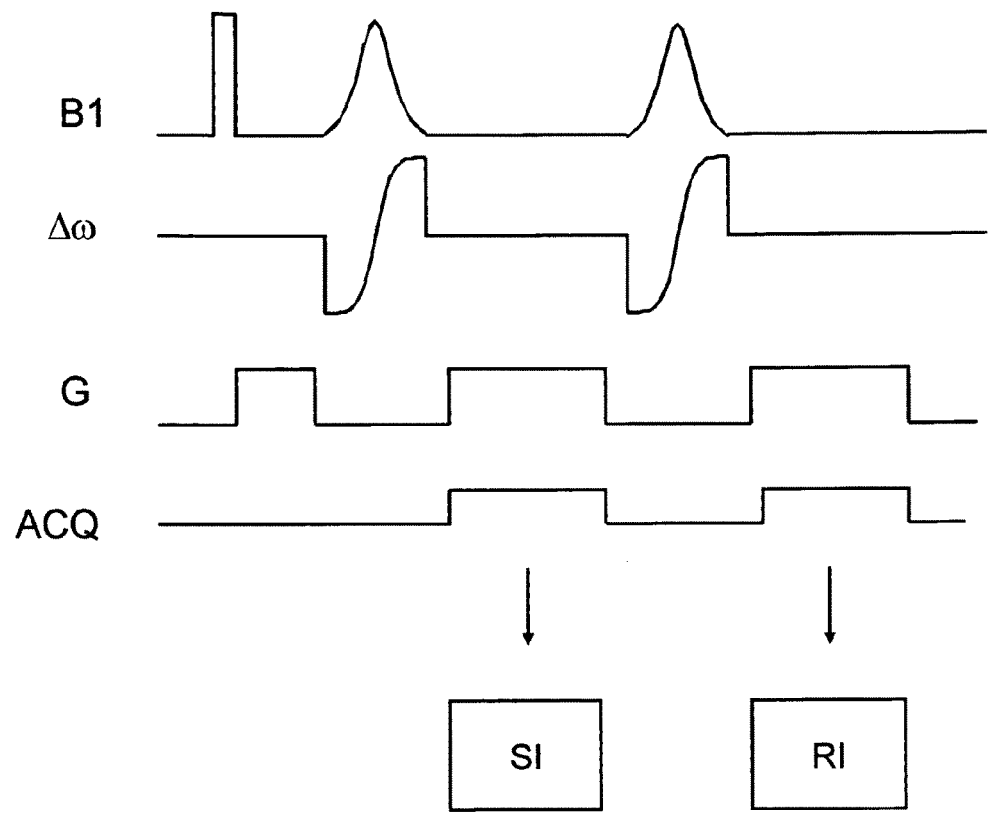
FIG. 6: Schematic depiction of the pulse sequence of an embodiment of the invention using two AFP pulses for the generation of two spin echoes. The first echo is used for the B1-sensitive image (SI) and the second one for the reference image (RI). The meaning of the symbols is identical with FIG. 4. The time course of the gradient is not essential for the invention. The actual time course may be different and may include more gradient channels.

Another useful embodiment of the invention is based on a sequence of three RF pulses, whereby the first one is an excitation pulse that can have any form, while the second and the third pulses are adiabatic full-passage pulses, compare FIG. 6 for the pulse sequence. All three pulses may be applied in the presence of a gradient of the static magnetic field to produce a slice selection.

This sequence produces two spin-echo signals appearing after the first and the second AFP pulse, correspondingly. The second spin-echo in this type of sequence is known to have the amplitude and the phase independent of the B1 field strength, and has been used to acquire signals with surface transmission coils [8]. In this embodiment, however, the first echo is of main interest since its phase is dependent on the B1 field amplitude. The first echo is thus used to reconstruct the B1-sensitive image, while the second echo is used to reconstruct the reference image. The final phase map is calculated as a phase difference between these two complex images, as described before.

The images represented in FIG. 1 have been acquired with this method using a volume transmission coil. The rapid phase variations seen on the final phase image show the abrupt reduction of the B1 amplitude at both ends of the sensitive volume.

Variant Using a Fast Spin Echo Technique Applying a Train of AFP Pulses

Another particularly useful embodiment of the invention uses the principles of the RARE imaging method [7], commonly called the Fast Spin Echo. This method generates a train of spin echoes with an excitation RF pulse followed by a periodic series of refocusing RF pulses and applies pulses of magnetic field gradients to encode each of these echoes differently.

Figure 7:
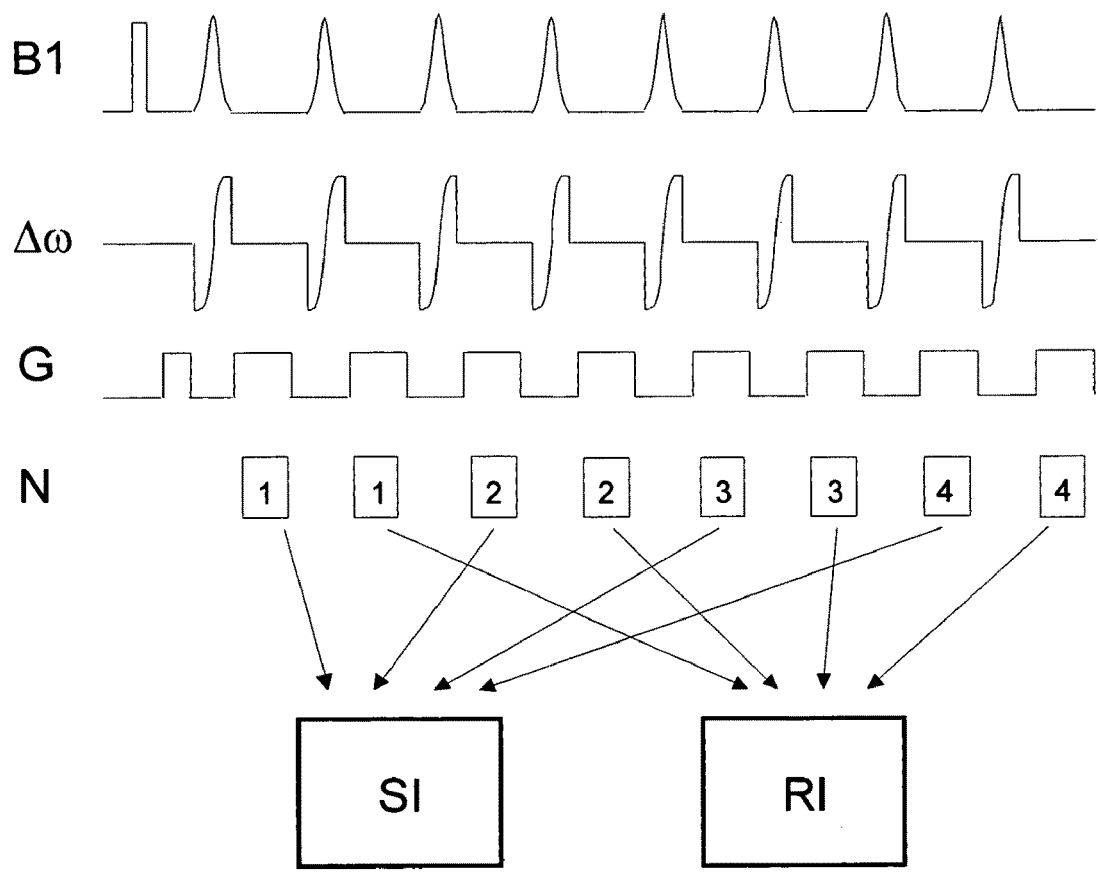
FIG. 7: Schematic depiction of the pulse sequence of an embodiment of the invention using a series of AFP pulses for the generation of two RARE (or Fast Spin Echo) images. Each pair of echoes undergoes the same encoding step (N). The odd echoes are used to reconstruct the B1-sensitive image (SI) and the even echoes are used for the reference image (RI). The sequence represented here uses eight echoes but can be modified for any number echoes by an expert in the field. The meaning of the symbols is identical with FIG. 4. The time course of the gradient is not essential for the invention. The actual time course may be different and may include more gradient channels.

In this embodiment, all refocusing pulses are AFP pulses. Since each of the AFP pulses produces a 180 degree flip of the transverse magnetization plane, and additionally rotates it around the main magnetic field axis by the B1-dependent angle φ, all odd echoes exhibit the same B1-dependence of the phase, while the phase of all the even echoes is B1-independent. The odd echoes are therefore used to reconstruct the B1-sensitive image, while the even echoes are used to reconstruct the reference image, and the final phase map is reconstructed as a phase difference between these. To make both groups of echoes equivalent regarding the spatial encoding, the gradient pulses used to encode consecutive pairs of echoes are identical. This sequence is represented in FIG. 7.

The advantage of this embodiment is a significant reduction of the measurement time. If the transverse relaxation time is sufficient to acquire all echoes needed for the image reconstructions in a single train, the entire experiment comprises only a single excitation and can be performed in sub-second time.

In summary, the present invention proposes, in particular, a method to determine the spatial distribution of the intensity of the radio-frequency transmission field (B1 field) in a magnetic resonance imaging apparatus based on a magnetic resonance imaging experiment, wherein a B1-sensitive complex image is acquired using one or more adiabatic radio-frequency pulses having a frequency sweep ending off resonance applied in such a way that the resulting transverse magnetization has a phase component dependent on the amplitude of the B1 field, and a reference complex image is acquired in such a way that the component of the phase of the transverse magnetization that is not dependent on the amplitude of the B1 field is the same as in the B1-sensitive image, but the B1-dependent component is different, and the spatial distribution of the B1 field is calculated based on the phase difference between the B1-sensitive image and the reference image.

REFERENCES

[1] R. Stollberger and P. Wach, *Magn. Reson. Med.* 35, 246-251 (1996)
[2] V. L. Yarnykh, *Magn. Reson. Med.* 57, 192-200 (2007)
[3] G. R. Morell, U.S. Pat. No. 6,268,728 (1999)
[4] G. R. Morell, *Magn. Reson. Med.* 60, 889-894 (2008)
[5] A. Tannus and M. Garwood, *NMR Biomed.*, 10, 423-434 (1997)
[6] M. Garwood and K. Ugurbil, U.S. Pat. No. 5,019,784 (1991)
[7] J. Hennig, A. Nauerth, H. Friedburg, *Magn. Reson. Med.* 3, 823-833 (1986)
[8] S. Conolly at al., *Magn. Reson. Med.* 18, 28-38 (1991)

I claim:

1. A method for determining a spatial distribution of a magnitude of a radio frequency transmission B1 field in a magnetic resonance imaging apparatus by performing an MRI experiment in which a B1-sensitive complex image of a sample is obtained, with a real part and an imaginary part, wherein a phase distribution within the B1-sensitive complex image depends on the spatial distribution of the magnitude of the B1 field, the phase being determined by an arc tangent function, the method comprising the steps of:

a) applying one or more adiabatic RF pulses with a frequency sweep ending off-resonance for establishing a dependency of the phase distribution within the B1-sensitive complex image on the spatial distribution of the B1 field;

b) obtaining a reference complex image of the sample for eliminating any superimposed phase distribution components of the B1-sensitive complex image which are independent of the B1 field, the reference complex image of the sample having a same superimposed phase distribution components;

c) generating a phase difference image of the B1-sensitive complex image and the reference complex image; and d) calculating a B1 magnitude image from the phase difference image of step c).

2. The method of claim 1, wherein the B1-sensitive complex image is acquired with a gradient-echo imaging method using an adiabatic half-passage RF excitation pulse with a frequency sweep starting on-resonance, and the reference complex image is acquired with a same gradient-echo imaging method using a non-adiabatic RF pulse.

3. The method of claim 1, wherein the MRI experiment comprises an imaging sequence which contains an excitation RF pulse of any type, followed by an adiabatic full-passage refocusing pulse to generate a first spin-echo signal, which, in turn, is followed by a second adiabatic full-passage refocusing pulse to produce a second spin-echo signal, wherein the first spin echo signal is used to produce the B1-sensitive complex image and the second spin-echo signal is used to produce the reference complex image.

4. The method of claim 1, wherein the MRI experiment comprises an imaging sequence which contains an excitation RF pulse of any type followed by a periodic train of adiabatic full-passage RF pulses to produce a train of spin-echoes, in which, after every two spin-echoes, an encoding changes so that consecutive pairs of spin-echoes are differently encoded, wherein odd spin-echoes are used to produce the B1-sensitive complex image and even spin-echoes are used to produce the reference complex image.

5. The method of claim 1, wherein the B1 magnitude image is saved digitally and used for image postprocessing.

6. The method of claim 1, wherein the B1 magnitude image is used to determine parameters controlling RF transmission in an MRI apparatus.

* * * * *